United States Patent [19]

Badawi

[11] Patent Number: 4,581,076
[45] Date of Patent: Apr. 8, 1986

[54] SELECTIVELY IMPLANTING GAAS SEMICONDUCTOR SUBSTRATES THROUGH A METALLIC LAYER

[75] Inventor: Mohamed H. Badawi, Stansted, Great Britain

[73] Assignee: ITT Industries, Inc., New York, N.Y.

[21] Appl. No.: 597,245

[22] Filed: Apr. 5, 1984

[30] Foreign Application Priority Data

Apr. 5, 1983 [GB] United Kingdom ................ 8309125

[51] Int. Cl.[4] .................... H01L 21/265; H01L 21/20
[52] U.S. Cl. ........................................ 148/1.5; 29/571;
29/576 B; 148/187; 148/DIG. 84; 357/23.1;
357/91
[58] Field of Search ............... 148/1.5, 187; 29/576 B,
29/571; 357/23, 91

[56] References Cited

U.S. PATENT DOCUMENTS

| | | | |
|---|---|---|---|
| 4,297,782 | 11/1981 | Ito ........................................ | 29/571 |
| 4,298,403 | 11/1981 | Davey et al. ........................ | 148/1.5 |
| 4,325,747 | 4/1982 | Ristow ................................. | 148/1.5 |
| 4,330,343 | 5/1982 | Christow et al. .................... | 148/1.5 |
| 4,344,980 | 8/1982 | Yoder .................................. | 148/1.5 |
| 4,421,577 | 12/1983 | Spicer ................................. | 148/187 |
| 4,426,765 | 1/1984 | Shahriary et al. ................... | 29/571 |
| 4,473,939 | 10/1984 | Feng et al. .......................... | 29/571 |

OTHER PUBLICATIONS

Ishiwara et al., Proc. 1976 Int. Conf. on Solid St. Devices, Tokyo, Jap. J. Appl. Phys. 16 (1977) 53.

Primary Examiner—Upendra Roy
Attorney, Agent, or Firm—Donald J. Lenkszus

[57] ABSTRACT

Ions are selectively implanted into layers of a semiconductor substrate of, for example, semi-insulating gallium arsenide via a photoresist implantation mask and a metallic layer of, for example, titanium, disposed between the substrate surface and the photoresist mask. After implantation the mask and metallic layer are removed and the substrate heat treated for annealing purposes. The metallic layer acts as a buffer layer and prevents possible contamination of the substrate surface, by photoresist residues, at the annealing stage. Such contamination adversely affects the electrical properties of the substrate surface, particularly gallium arsenide substrates.

10 Claims, 5 Drawing Figures

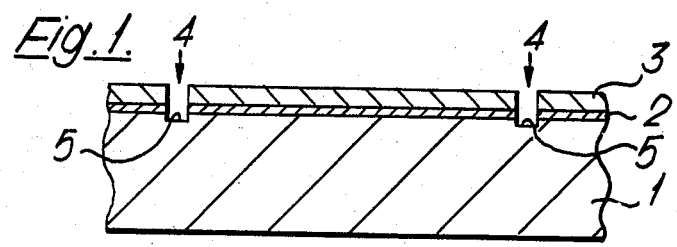
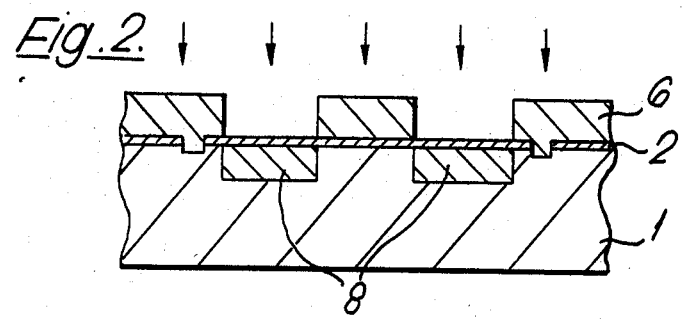
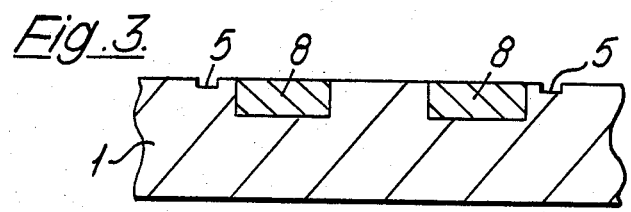
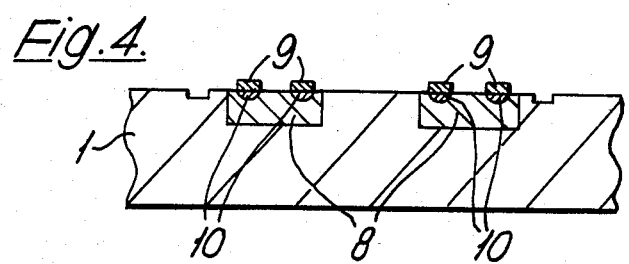
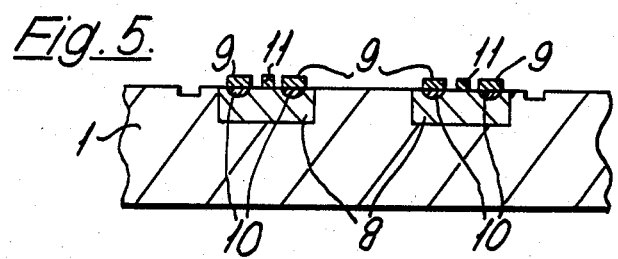

SELECTIVELY IMPLANTING GAAS SEMICONDUCTOR SUBSTRATES THROUGH A METALLIC LAYER

BACKGROUND OF THE INVENTION

This invention relates to semiconductor processing and in particular to ion implantation techniques.

SUMMARY OF THE INVENTION

According to the present invention there is provided a process for implanting ions into a semiconductor substrate comprising the steps of depositing a metallic layer on a surface of the substrate, providing a photoresist implantation mask on the metallic layer, and bombarding the substrate with ions whereby ions become selectively implanted into regions of the substrate via corresponding windows of the mask and the metallic layer.

BRIEF DESCRIPTION OF THE DRAWINGS

Embodiments of the present invention will now be described with reference to the accompanying drawings, in which:

FIGS. 1 to 5 show successive stages in the fabrication of discrete field effect transistors.

DETAILED DESCRIPTION

The drawings illustrate the fabrication of field effect transistors, i.e., a semi-insulating gallium arsenide substrate 1. The active regions required for the transistors are achieved by ion implantation. A thin titanium layer 2 (approximately 400 A thick) is evaporated onto a surface of the substrate (FIG. 1). A layer 3 of a positive photoresist is spun onto the titanium layer 2. Small windows 4 are opened in the photoresist layer 3 and through these windows 4 registration marks 5 are etched in the gallium arsenide surface. The layer 3 is removed and a fresh layer 6 (FIG. 2) of a positive photoresist applied. Large windows 7 are opened in the photoresist layer 6, thus defining a photoresist implantation mask.

The photoresist masked surface of the gallium arsenide substrate I is then subjected to bombardment with, for example, $Si^{29}$ ions, as indicated by the arrows, which are thus selectively implanted through the titanium layer 2 into regions of the substrate in order to provide conductive, in this case n-type, regions 8.

The photoresist layer 6 is removed by a suitable solvent and the titanium layer is removed by etching with HF thus achieving the selectively doped gallium arsenide structure shown in FIG. 3. In order to remove implantation induced damage of the structure it is subjected to heat treatment at approximately 850° C. by means, for example, of a capless annealing technique, that is a heat treatment without the provision of a layer on top of the GaAs substrate, thus the structure as shown in FIG. 3 is heat treated.

Source and drain electrodes 9 and regions 10 are then provided (FIG. 4). This may be achieved by means by metallization lift-off process comprising applying a relatively thick photoresist layer to the annealed substrate; providing windows in the photoresist layer corresponding to the required source and drain electrodes and regions; metallizing the photoresist layer and the regions 8 where exposed by the windows with an electrode/dopant metal such as a gold/germanium/nickel alloy, the photoresist is relatively thick in comparison with the alloy layer to ensure that the alloy layer breaks at the edges of the windows; stripping off the photoresist layer together with the surplus metal, leaving the metal electrodes 9 disposed on the regions 8; and heating the assembly to a sufficient temperature to diffuse the germanium from the metal electrodes 9 into the region 8, thus providing source and drain regions 10 with a high doping level, in this case n+, in the regions 8.

Using a similar metallisation lift-off process, this time employing a Schottky metal, for example chromium/gold, a Schottky barrier gate electrode 11 is disposed between the source and drain electrodes 9 of each transistor. Finally the produced assembly is divided into individual devices or circuits which are then contacted or packaged.

The thin layer of titanium acts as a buffer layer between the photoresist and the gallium arsenide surface, and prevents any possible contamination of the gallium arsenide surface, which may result from photoresist residues when such a buffer layer is not used. Such residues are particularly undesirable when employing ion implantation techniques since the substrate must be subjected to heat treatment, the annealing process, after ion implantation and the surface of the substrate, if the photoresist is not fully cleaned off, will become contaminated and the electrical properties of the wafer will be adversely affected. These residues are particularly encountered with gallium arsenide substrates since it is not possible to rigorously clean photoresist from a surface thereof without adversely affecting the surface.

Whereas the invention has basically been described with respect to discrete devices it is also applicable to the fabrication of integrated circuits on gallium arsenide substrates. Whereas only a titanium buffer layer has been described above other metallic layers of, for example, tin, chromium, aluminum, manganse, magnesium or indium, may be similarly employed. Such metallic layers, and any photoresist residues therein, can be simply and effectively removed by HF or HCL etching, for example, without damaging the substrate surface. Whereas the semiconductor body into which ions are implanted, has been specifically described as gallium arsenide, other semiconductors, for example, other compound semiconductors or silicon may be similarly processed. It is possible to merely use a patterned photoresist layer for the selective ion implantation of silicon, since the latter can be subjected to a very rigorous cleaning process, to ensure that no photoresist residues remain before annealing, without adversely affecting the surface of the silicon. However in certain instances it may be preferable to use the metallic buffer layer described above.

What is claimed is:

1. A process for implanting ions into a GaAs semiconductor substrate comprising the steps of:
   depositing a metallic layer on a surface of the substrate;
   providing a photoresist implantation mask on said metallic layer; and
   bombarding the substrate with ions whereby ions become selectively implanted through said metallic layer into regions of the substrate via corresponding windows of said mask.

2. A process in accordance with claim 1, further including the steps of:
   removing said photoresist mask and said metallic layer; and heat treating the ion-implanted substrate whereby to remove implantation induced damage.

3. A process in accordance with claim 1, wherein said metallic layer is of titanium.

4. A process in accordance with claim 2, wherein said metallic layer is of titanium.

5. A method of manufacturing a field-effect transistor including the steps of:
   depositing a metallic layer on a surface of the substrate;
   providing a photoresist implantation mask on said metallic layer;
   bombarding the substrate with ions whereby ions become selectively implanted through said metallic layer into regions of the substrate via corresponding windows of said mask,
   forming spaced apart source and drain electrodes of an electrode/dopant metal on said surface of said region;
   alloying the electrodes to diffuse the dopant into the region to provide source and drain regions of said one conductivity type, but with a higher doping level; and
   forming a gate electrode on said surface of the region between said source and drain electrodes.

6. A method in accordance with claim 5, wherein the electrode/dopant metal comprises a gold/germanium/nickel alloy.

7. A method in accordance with claim 5, wherein said gate electrode is formed of a Schottky metal.

8. A method in accordance with claim 6 wherein said gate electrode is formed of a Schottky metal.

9. A method in accordance with claim 6, wherein said Schottky metal electrode comprises chromium/gold.

10. A method in accordance with claim 7, wherein said Schottky metal electrode comprises chromium/gold.

* * * * *